(12) United States Patent
Matsumoto et al.

(10) Patent No.: US 11,877,430 B2
(45) Date of Patent: Jan. 16, 2024

(54) IMAGING DEVICE

(71) Applicant: Panasonic Intellectual Property Management Co., Ltd., Osaka (JP)

(72) Inventors: Yasutaka Matsumoto, Tokyo (JP); Makoto Saito, Kanagawa (JP); Yoshihisa Shimazu, Kanagawa (JP); Keiichi Ujita, Kanagawa (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 17/743,981

(22) Filed: May 13, 2022

(65) Prior Publication Data

US 2022/0377950 A1   Nov. 24, 2022

(30) Foreign Application Priority Data

May 21, 2021   (JP) .................................. 2021-086420

(51) Int. Cl.
*H05K 9/00* (2006.01)
*H04N 23/51* (2023.01)
*H04N 23/52* (2023.01)

(52) U.S. Cl.
CPC ........... *H05K 9/0009* (2013.01); *H04N 23/51* (2023.01); *H04N 23/52* (2023.01)

(58) Field of Classification Search
CPC ....... H04N 23/51; H04N 23/52; H05K 9/0009
See application file for complete search history.

(56) References Cited

U.S. PATENT DOCUMENTS

| 8,970,700 | B2* | 3/2015 | Inoue | H04N 23/52 |
| | | | | 348/148 |
| 11,381,719 | B2 | 7/2022 | Nakamura | |
| 2009/0225214 | A1* | 9/2009 | Takizawa | H04N 23/55 |
| | | | | 359/507 |
| 2013/0322021 | A1* | 12/2013 | Ohoka | H05K 9/0009 |
| | | | | 361/679.01 |
| 2014/0146227 | A1 | 5/2014 | Maekawa et al. | |
| 2017/0272624 | A1 | 9/2017 | Minikey, Jr. et al. | |
| 2017/0320449 | A1* | 11/2017 | Park | H04N 23/54 |
| 2018/0007278 | A1* | 1/2018 | Hirabayashi | H04N 1/00408 |
| 2019/0041600 | A1 | 2/2019 | Sakamoto et al. | |
| 2019/0227411 | A1* | 7/2019 | Park | H05K 9/0007 |

(Continued)

FOREIGN PATENT DOCUMENTS

| EP | 3 944 605 A1 | 1/2022 |
| EP | 3 944 606 A1 | 1/2022 |

(Continued)

OTHER PUBLICATIONS

Japanese Office Action, dated Nov. 21, 2023, for Japanese Patent Application No. 2021-086420. (9 pages) (with English translation).

*Primary Examiner* — Amy R Hsu
(74) *Attorney, Agent, or Firm* — Seed IP Law Group LLP

(57) ABSTRACT

An imaging device according to the present disclosure includes a front case, a rear case, and a shield member. The front case supports an imaging optical unit. The rear case includes an electrically conductive output mechanism configured to output a signal output from the imaging optical unit. The shield member electrically connects the front case and the output mechanism.

16 Claims, 7 Drawing Sheets

(56) References Cited

U.S. PATENT DOCUMENTS

| | | | |
|---|---|---|---|
| 2020/0191860 A1* | 6/2020 | Lee | G01R 27/08 |
| 2020/0252527 A1 | 8/2020 | Nakamura | |
| 2021/0092271 A1* | 3/2021 | Nakamura | H04N 23/54 |
| 2021/0197733 A1* | 7/2021 | Percival | H04N 23/52 |
| 2021/0294067 A1* | 9/2021 | Park | G03B 5/00 |

FOREIGN PATENT DOCUMENTS

| | | |
|---|---|---|
| JP | 2008271504 A | 11/2008 |
| JP | 2011035680 A | 2/2011 |
| JP | 2011-259101 A | 12/2011 |
| JP | 2018164189 A | 10/2018 |
| JP | 2018164190 A | 10/2018 |
| JP | 2019047435 A | 3/2019 |
| JP | 2019511874 A | 4/2019 |
| JP | 2019078986 A | 5/2019 |
| JP | 2020-155984 A | 9/2020 |
| JP | 2020-155985 A | 9/2020 |
| KR | 20180118459 A | 10/2018 |
| WO | 2017134894 A1 | 8/2017 |
| WO | 2019188847 A1 | 10/2019 |

\* cited by examiner

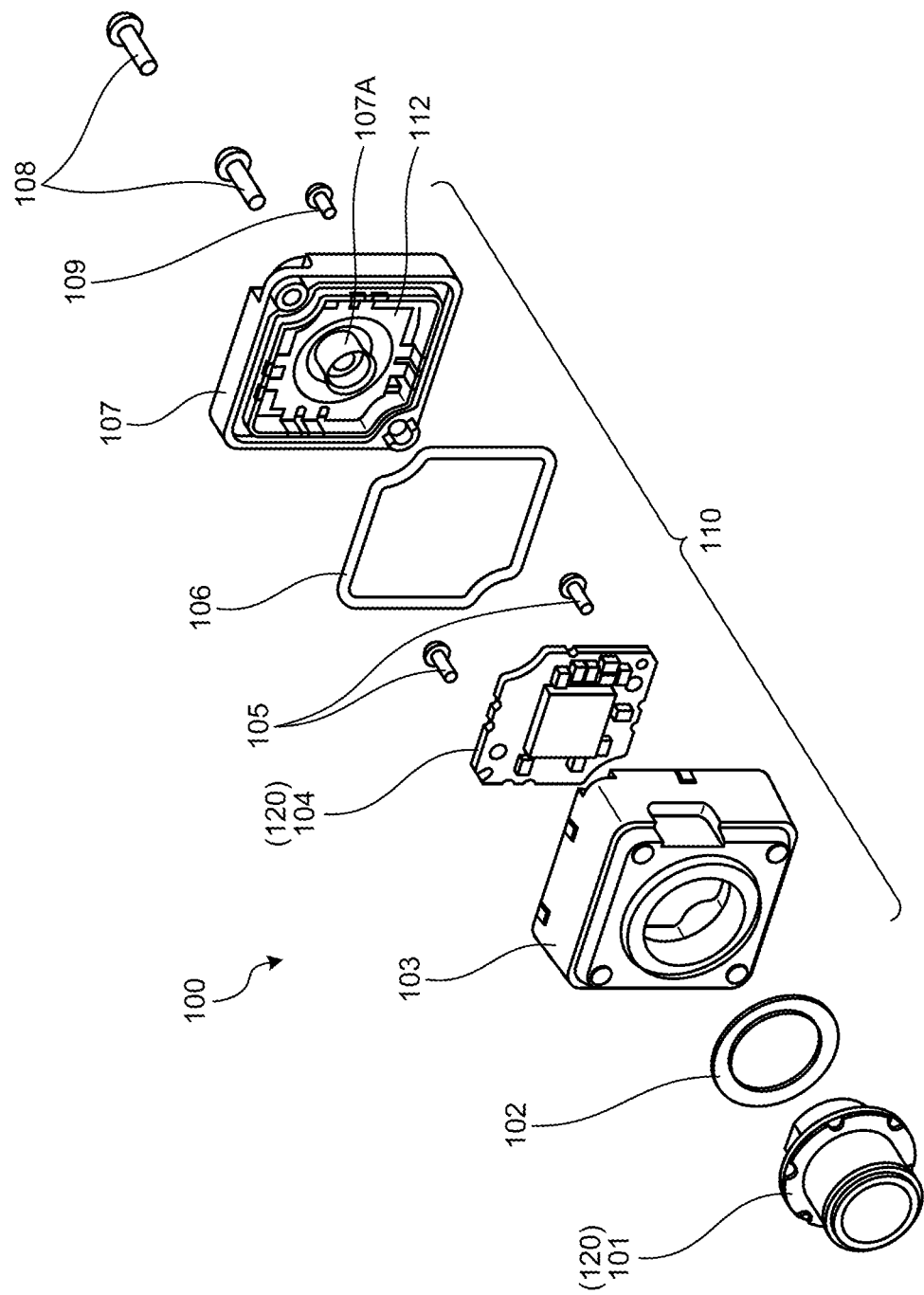

IMAGING DEVICE

CROSS-REFERENCE TO RELATED APPLICATIONS

This application is based upon and claims the benefit of priority from Japanese Patent Application No. 2021-086420, filed on May 21, 2021, the entire contents of which are incorporated herein by reference.

FIELD

Embodiments described herein relate generally to an imaging device.

BACKGROUND

In recent years, with the widespread use of driver assistance systems in vehicles, there is an increasing trend of vehicles on which peripheral monitoring systems using onboard cameras and mirror replacement systems using onboard cameras are mounted. In general, electronic devices and the like are disposed around imaging devices mounted on vehicles. In such a case, the imaging devices may be affected by electromagnetic waves radiated from electronic devices and the like that are disposed around the imaging devices. As a result, disruptions may be caused in video signals or malfunction of the imaging devices may occur, which may prevent the provision of highly reliable images necessary for driver assistance.

Therefore, a configuration in which electromagnetic shielding structures are disposed in a case itself or inside the case of an imaging device has been adopted. For example, it is disclosed in Japanese Patent Application Laid-open No. 2011-259101 to provide an imaging device in which a sensor board is surrounded by a shield case made of an electrically conductive material. For example, Japanese Patent Application Laid-open No. 2020-155984 and Japanese Patent Application Laid-open No. 2020-155985 disclose an imaging device provided with a sheet metal including a shield portion that covers a part or the entire circumference of a side surface of a board.

However, the following issues still exist in the above described related art. Specifically, in the related art, a shield member may not sufficiently function as an electromagnetic wave shield due to an insufficient contact pressure between the shield member and a member in contact with the shield member, and an increased contact resistance between the shield member and the member in contact with the shield member. Therefore, in the related art, noise immunity may be degraded.

SUMMARY

An imaging device according to the present disclosure includes a first case, a second case, and a first shield member. The first case has electrical conductivity and supports an imaging optical unit. The second case includes an electrically conductive output mechanism configured to output a signal output from the imaging optical unit. The first shield member is configured to electrically connect the first case and the output mechanism.

BRIEF DESCRIPTION OF THE DRAWINGS

FIG. 2 is an exploded view of the imaging device according to the first embodiment;

DETAILED DESCRIPTION

An imaging device according to the present disclosure will be described with reference to the drawings described below.

First Embodiment

A configuration of an imaging device 100 according to a first embodiment will be described with reference to FIGS. 1 to 5.

Figure 1:
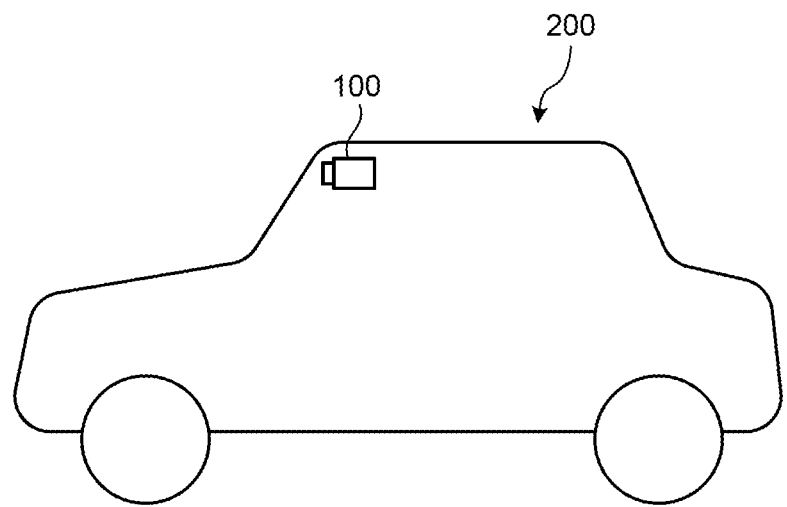
FIG. 1 is an arrangement diagram of an example of an imaging device according to a first embodiment.

FIG. 1 is an arrangement diagram of an example of the imaging device 100 according to the present embodiment. The imaging device 100 is mounted on a moving object 200, for example. The moving object 200 is, for example, a vehicle, a ship, an aircraft, a drone, or the like. In the present embodiment, the form in which the moving object 200 is a vehicle will be described as an example. A portion where the imaging device 100 is mounted is not limited to FIG. 1, and the imaging device 100 may be mounted on the front, rear, and side mirrors of the vehicle, for example. In the present example, an example of the imaging device 100 mounted on the vehicle is described as an example, but the imaging device 100 is not limited to the form in which the imaging device 100 is mounted on the vehicle. Furthermore, the imaging device 100 may be installed on a non-moving object.

FIG. 2 is an exploded view of the example of the imaging device according to the present embodiment. The imaging device 100 includes a lens barrel 101, a front case 103, a sensor board 104, sensor board fixing screws 105, a waterproof packing 106, a rear case 107, case fixing screws 108, an air hole screw 109, and a shield member 112.

The lens barrel 101 and the sensor board 104 are examples of imaging optical units 120. The imaging optical units 120 include a lens, an imaging element, and the like, and obtain an image signal by imaging an image. The lens is provided on the lens barrel 101, for example. The imaging element is provided on the sensor board 104, for example.

The lens barrel 101 is attached to the outside of the front case 103. The sensor board 104 is attached to the inside of the front case 103 by the sensor board fixing screws 105.

The front case 103 is an example of a first case. The front case 103 supports the lens barrel 101 and the sensor board 104 that are the imaging optical units 120. The front case 103 is an electrically conductive member.

The rear case 107 is an example of a second case. The rear case 107 has an output mechanism 107A that outputs a signal output from each of the imaging optical units 120. The output mechanism 107A is an electrically conductive connection portion through which an electrical cable or the like outputting an image signal that is the signal output from each of the imaging optical units 120 is connected.

The rear case 107 is attached to the front case 103 by the case fixing screws 108. As described above, the sensor board 104 is attached to the front case 103. As a result, the sensor board 104 is sandwiched between the front case 103 and the rear case 107, and is in a supported state. For the purpose of improving waterproof properties, it is preferable to adopt a configuration in which the waterproof packing 106 made of rubber is provided between the front case 103 and the rear case 107. Hereinbelow a structure formed by attaching the rear case 107 to the front case 103 may be referred to as a housing 110.

The shield member 112 electrically connects the front case 103 and the output mechanism 107A. In the present embodiment, the shield member 112 is provided between the rear case 107 and the front case 103.

Main members constituting the imaging device 100 is described with more details.

Lens Barrel 101

The lens barrel 101 is attached to the front case 103 through an adhesive 102, and is a cylindrical member into which a lens is incorporated. The lens barrel 101 can be formed using a resin material, for example.

The lens incorporated into the lens barrel 101 is made of plastic, glass, or the like. The lens is disposed along an optical axis inside the lens barrel 101 and images light from a subject on the imaging element of the sensor board 104.

Front Case 103

The lens barrel 101 is attached to the front case 103 in such a manner that the lens barrel 101 is attached to the outside of the front case 103, that is, the lens barrel 101 is attached to an opposite side to a side to which the rear case 107 is attached. It is preferable that a hole having the same shape as that of an end surface of the lens barrel 101 is formed on a surface of the front case 103, to which the lens barrel 101 is attached. By fitting one end of the lens barrel 101 into the hole in the front case 103, the lens barrel 101 is attached to the front case 103.

A surface that is a peripheral edge of the hole in the front case 103 and is a surface with which the end surface of the lens barrel 101 comes into contact is coated with the adhesive 102 for fixing the lens barrel 101. The housing 110 is fixed to the lens barrel 101 with the adhesive 102 in a state in which a relative positional relationship between the imaging element and the lens barrel 101 has been adjusted.

The adhesive 102 has at least curing properties by heat treatment. In order to attach the front case 103 to the lens barrel 101 with higher accuracy, the adhesive 102 preferably has a property of being temporarily cured by, for example, ultraviolet (UV) irradiation prior to the main curing by heat treatment. Examples of the adhesive 102 that is cured through such two steps include adhesive containing an epoxy resin. By curing the adhesive 102 with the UV irradiation in advance, the lens barrel 101 attached to the housing 110 is prevented from shifting its position until the adhesive 102 is cured by heat treatment.

As a material of the front case 103, any electrically conductive member may be adopted. The material of the front case 103 can be, for example, a metal such as aluminum, an electrically conductive resin, or the like.

Sensor Board 104

The sensor board 104 is a board on which the imaging element is mounted. The imaging element is, for example, a complementary MOS (CMOS) or a charge coupled device (CCD). The imaging element receives light that has passed through the lens in the lens barrel 101 and converts the light into an image signal.

Holes through which the sensor board fixing screws 105 pass are formed on edge portions of the sensor board 104. The sensor board 104 is fixed to the front case 103 by the sensor board fixing screws 105 through the holes thereof. For example, a metal such as stainless steel can be used as a material of the sensor board fixing screws 105. The sensor board 104 is fixed to the front case 103 by the sensor board fixing screws 105 to be electrically connected to the front case 103 through the sensor board fixing screws 105.

Waterproof Packing 106

The waterproof packing 106 is a sealing member to keep an inner space of the housing 110 airtight. The waterproof packing 106 is sandwiched between the front case 103 and the rear case 107, and is pressed from both sides. As a result, the waterproof packing 106 seals a mating surface of the front case 103 and the rear case 107, and the imaging device 100 has a waterproof function. Any elastic material, such as rubber for example, can be used as a material of the waterproof packing 106.

Rear Case 107

Figure 3A:
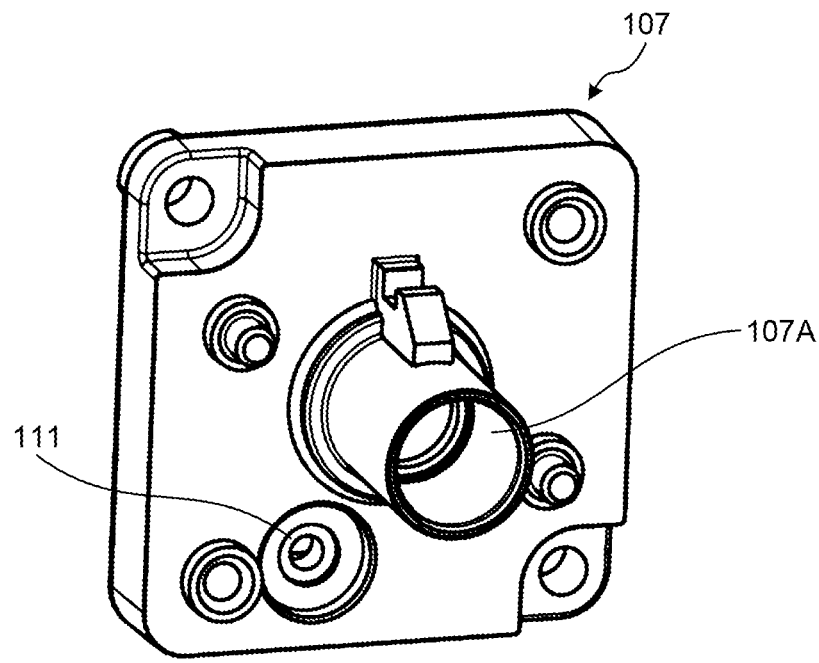
FIG. 3A is a perspective view of a rear case according to the first embodiment, which is viewed from an output mechanism side.
Figure 3B:
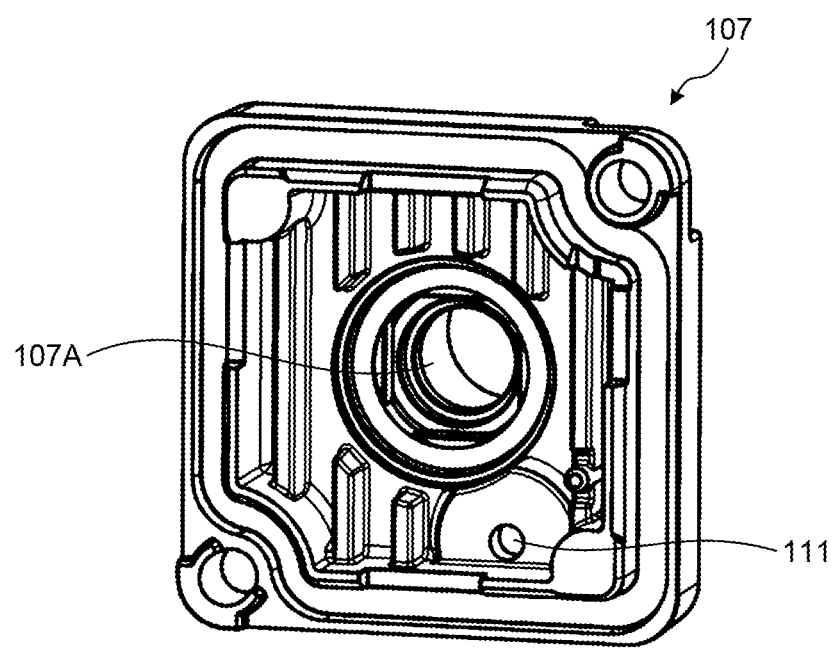
FIG. 3B is a perspective view of the rear case according to the first embodiment, which is viewed from a lens barrel side.

The rear case 107 will be described with reference to FIGS. 2, 3A, and 3B. FIG. 3A is a perspective view of the rear case 107, which is an example viewed from the output mechanism 107A side. FIG. 3B is a perspective view of an example of the rear case 107, which is an example viewed from the lens barrel 101 side.

The rear case 107 includes the output mechanism 107A to output an image signal. As described above, the output mechanism 107A is an electrically conductive connection portion through which an electrical cable outputting an image signal that is the signal output from each of the imaging optical units 120 is connected. Examples of the output mechanism 107A include a coaxial (2-wire type) connector, a shield twisted quad wire (STQ) (4-wire type) connector, a STQ with CAN (6-wire type) connector, and the like.

An air hole 111 is formed in the rear case 107. The air hole 111 is a hole through which the inner space of the housing 110 and the outer space of the housing 110 are connected to each other. The air hole 111 is sealed by the air hole screw 109.

The rear case 107 may be any member as long as the output mechanism 107A of the rear case 107 is electrically conductive. Portions of the rear case 107 other than the output mechanism 107A may be or may not be electrically conductive. For example, a resin or a metal can be used as a material of the portions of the rear case 107 other than the output mechanism 107A. From the viewpoint of moldability, it is preferable to be made of a resin, and from the viewpoint of heat dissipation, it is preferable to be made of a metal. The front case 103 and the rear case 107 may be made of the same material, or each may be made of a different material.

Shield Member 112

Figure 4:
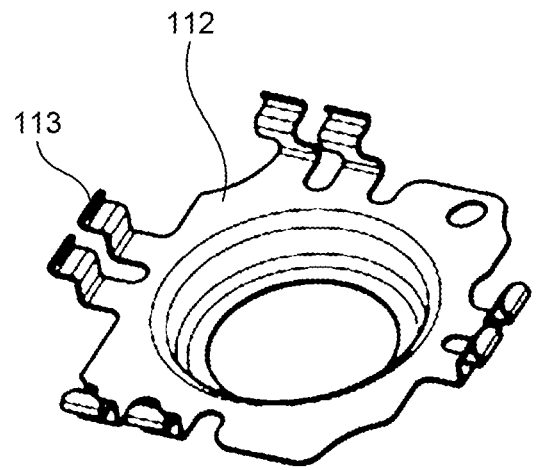
FIG. 4 is a perspective view of a shield member according to the first embodiment.
Figure 5:
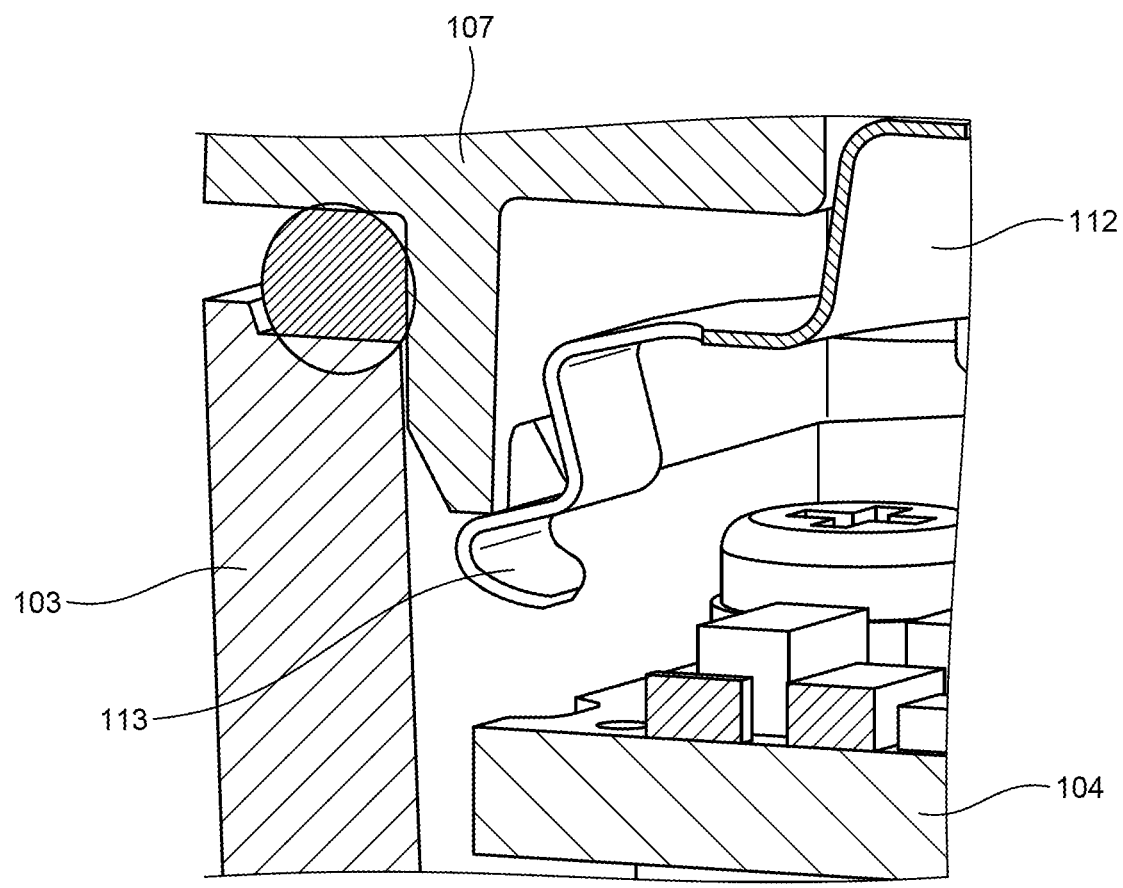
FIG. 5 is an enlarged cross-sectional view of a housing according to the first embodiment.

Next, a configuration and function of the shield member 112 will be described with reference to FIGS. 2, 4, and 5. FIG. 4 is a perspective view of an example of the shield member 112. FIG. 5 is an enlarged cross-sectional view of the housing 110.

The shield member 112 is electrically conductive. The shield member 112 electrically connects the front case 103 and the output mechanism 107A provided in the rear case 107.

As illustrated in FIGS. 2 and 4, the shield member 112 has a protruding shape in which the central portion protrudes in a direction away from the lens barrel 101 and is formed to cover the sensor board 104. The shield member 112 includes an opening portion on which the output mechanism 107A is installed.

In the present embodiment, a protruding portion 113 is provided at an end portion of the shield member 112. FIG. 4 illustrates, as an example, a configuration in which two protruding portions 113 are provided on each of the four sides of the rectangular-shaped shield member 112. That is, FIG. 4 illustrates, as an example, a configuration in which eight protruding portions 113 are provided on the shield member 112.

The protruding portion 113 is an example of a first protruding portion. As illustrated in FIGS. 4 and 5, each of the protruding portions 113 is a member that protrudes in a direction toward the front case 103. The shield member 112 is disposed to come into contact with the front case 103 through the protruding portions 113.

A contact resistance between the protruding portions 113 and the front case 103 may have any predetermined resistance value capable of lowering a potential of the output mechanism 107A to ground (GND) through the shield member 112, the protruding portions 113, and the front case 103. The imaging device 100 of the present embodiment is mounted on the moving object 200 to be connected to an electrically conductive site on the housing or the like of the moving object 200. Therefore, the output mechanism 107A is grounded through the shield member 112, the protruding portions 113, and the front case 103. Hereinbelow the predetermined resistance value may be referred to as a predetermined value of contact resistance. The predetermined value of the contact resistance between the protruding portions 113 and the front case 103 is, for example, equal to or less than 1Ω and is preferably equal to or less than 0.5Ω.

The protruding portion 113 is an elastic member. A shape of each of the protruding portions 113 may be a shape capable of achieving the amount of deflection, the maximum stress, and the minimum contact pressure against the front case 103 in order to reduce the contact resistance between the front case 103 and the protruding portions 113 to the above described predetermined value.

Materials of the shield member 112 and the protruding portions 113 may be any electrically conductive materials. For example, metals such as aluminum, electrically conductive resins, and the like can be used as materials of the shield member 112 and the protruding portions 113. The materials of the shield member 112 and the protruding portions 113 may be any materials that are electrically conductive and satisfy the Young's modulus, Poisson's ratio, and the yield strength in order to achieve the above described predetermined value of the contact resistance between the protruding portions 113 and the front case 103.

For example, it is assumed that two types of materials, SUS304-CSP 3/4H and SUS301-CSP H, are employed as materials of the shield member 112 and the protruding portion 113. For example, SUS304-CSP 3/4H is used for the protruding portions 113 with a long spring length, and SUS301-CSP H is used for the protruding portions 113 with a short spring length. For example, it is assumed that the Young's modulus of the shield member 112 and the protruding portions 113 is 193000 MPa and the Poisson's ratio thereof is 0.3. For example, it is assumed that the yield strength of the shield member 112 and the protruding portion 113 is 665 MPa in a case of using SUS304-CSP 3/4H, and is 1030 MPa in a case of using SUS301-CSP H. Under these conditions, in a case in which a displacement of 0.1 mm is applied to the protruding portions 113, and the contact resistance between the protruding portions 113 and the front case 103 is measured, a contact pressure is equal to or more than 0.3 N that is the minimum contact pressure for SUS301-CSP H, and is stable, thereby capable of achieving the contact resistance of equal to or less than 1Ω.

FIG. 4 illustrates an example in which eight protruding portions 113 are provided on the shield member 112, as an example. However, the number and positions of the protruding portions 113 are not limited to the example illustrated in FIG. 4. For example, the protruding portions 113 may be configured such that one protruding portion 113 is provided on each of the four sides of the rectangular-shaped shield member 112. Specifically, for example, the protruding portions 113 may be configured such that four protruding portions 113 are provided on the shield member 112.

Shapes, materials, quality of the materials, number, positions, and the like of the shield member 112 and the protruding portions 113 are not limited to the form described above, as long as the potential of the output mechanism 107A can be lowered to ground through the shield member 112, the protruding portions 113, and the front case 103.

FIG. 4 illustrates an example in which the plurality of protruding portions 113 having the same shape as one another are provided on the shield member 112, as an example. However, the shapes of the plurality of protruding portions 113 provided on the shield member 112 may be the same as one another, or at least one or more of the plurality of protruding portions 113 may have a shape different from other protruding portions 113. For example, a configuration in which protruding portions 113 with a long spring length and protruding portions 113 with a short spring length are provided in combination on each of the four sides of the rectangular-shaped shield member 112 may be adopted. In addition, a configuration in which the plurality of protruding portions 113 with the same spring length and different widths are provided on each side of the shield member 112 may be adopted. Furthermore, all of the shapes of the plurality of protruding portions 113 provided on the shield member 112 may be different from each other, depending on a shape of an area in contact with the front case 103.

Next, an action of the imaging device 100 according to the present embodiment will be described.

In the present embodiment, the shield member 112 is electrically conductive and electrically connects the electrically conductive front case 103 and the electrically conductive output mechanism 107A. In detail, the shield member 112 includes the protruding portions 113 and is disposed to come into contact with the front case 103 through the protruding portions 113.

Therefore, the front case 103, the output mechanism 107A of the rear case 107, the shield member 112, and each of the protruding portions 113 are electrically connected. Thus, a potential of the front case 103 is approximately the same as that of the output mechanism 107A of the rear case 107, that is, the potential of the front case 103 is approximately the same ground (GND) potential of the output mechanism 107A. That is, the output mechanism 107A of the rear case 107, the shield member 112, each of the protruding portions 113, and the front case 103 are electrically connected, so that the imaging device 100 can have a GND-reinforced structure.

As described above, the imaging device 100 of the present embodiment includes the front case 103, the rear case 107, and the shield member 112. The front case 103 supports the imaging optical units 120. The rear case 107 has the output mechanism 107A that is electrically conductive and outputs a signal output from each of the imaging optical units 120. The shield member 112 electrically connects the front case 103 and the output mechanism 107A.

Therefore, the front case 103, the output mechanism 107A of the rear case 107, and the shield member 112 are electrically connected, so that the imaging device 100 can have the GND-reinforced structure. That is, in the imaging device 100 of the present embodiment, the shield member 112 can sufficiently function as an electromagnetic wave shield. As a result, the imaging device 100 of the present embodiment can improve noise immunity against noise that is electromagnetic interference (EMI) and that is generated by signals in the external environment of the imaging device 100, which are output from a radio, a television, and the like.

Therefore, the imaging device 100 of the present embodiment can improve the noise immunity.

Since the present embodiment can improve the noise immunity, it is possible to provide the imaging device 100 that satisfies high performance and high noise immunity to noise.

In addition, in the imaging device 100 of the present embodiment, the shield member 112 can improve the noise immunity of the imaging device 100. Therefore, the imaging device 100 of the present embodiment can achieve miniaturization of the imaging device 100 in addition to the improvement of the noise immunity.

Second Embodiment

An imaging device according to a second embodiment will be described.

In the imaging device of the present embodiment, a configuration in which a plurality of boards 104C are laminated in the housing 110 is adopted. The boards 104C are an example of an electronic board.

The imaging device of the present embodiment has the same configuration as the imaging device 100 of the first embodiment, except for a configuration in which the plurality of boards 104C are laminated. The same numerals are given to the same members as those in the first embodiment, and detailed explanations will not be repeated.

Figure 6:
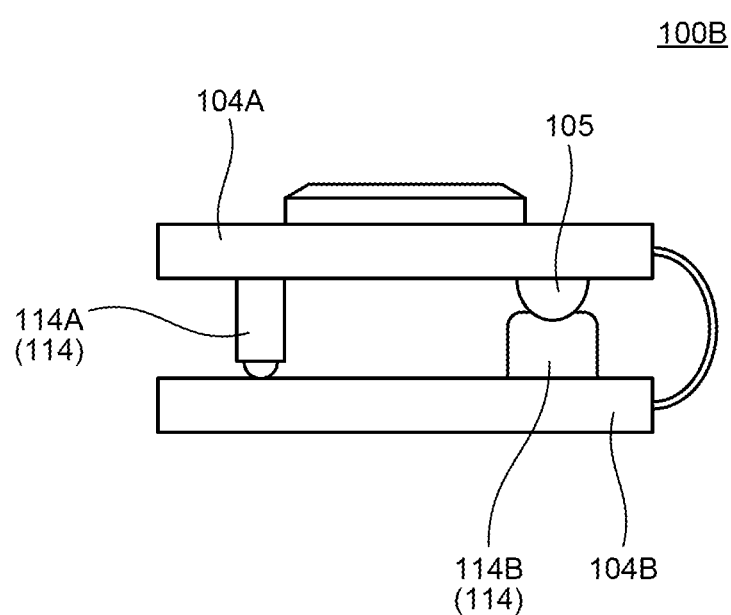
FIG. 6 is a schematic diagram of an example with an enlarged portion of boards of an imaging device according to a second embodiment.
Figure 7:
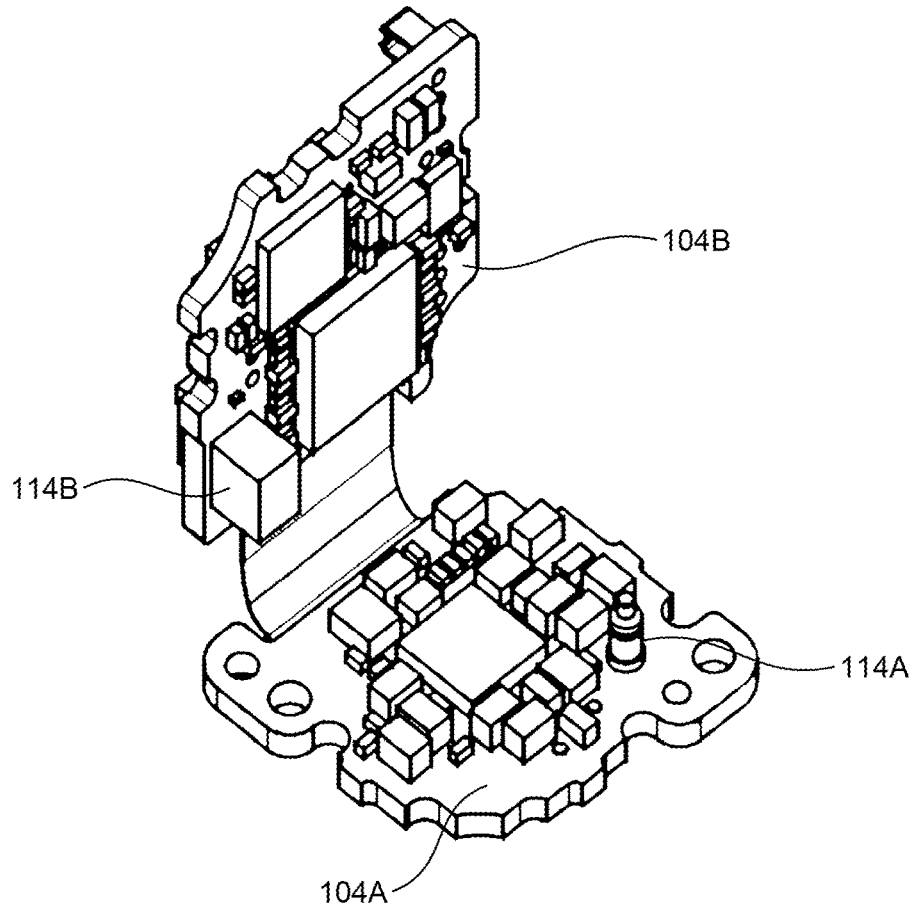
FIG. 7 is a perspective view of an example of a sensor-side board and a camera interface-side board according to the second embodiment.

FIG. 6 is a schematic diagram of an example with an enlarged portion of the boards 104C of an imaging device 100B according to the present embodiment. FIG. 7 is a perspective view of an example of a sensor-side board 104A and a camera interface-side board 104B.

In FIGS. 6 and 7, the sensor-side board 104A and the camera interface-side board 104B are illustrated as the boards 104C. The imaging device 100B may have a configuration in which three or more boards 104C are laminated.

The sensor-side board 104A is one board 104C that is fixed to the front case 103 through the sensor board fixing screws 105 (see FIG. 1). The camera interface-side board 104B is one board 104C that includes a mounting board connector to be fit with the output mechanism 107A and is integrated with the sensor-side board 104A via a flexible circuit.

Shield members 114 are provided between the sensor-side board 104A and the camera interface-side board 104B. The shield members 114 are an example of the second shield member. The shield members 114 are electrically conductive and elastic members that connect the plurality of boards 104C.

The shield members 114 may be any members that are electrically conductive and elastic. FIG. 6 illustrates a configuration in which a shield member 114A and a shield member 114B are provided between the sensor-side board 104A and the camera interface-side board 104B, as an example. The shield member 114A and the shield member 114B are an example of the shield members 114.

Figure 8:
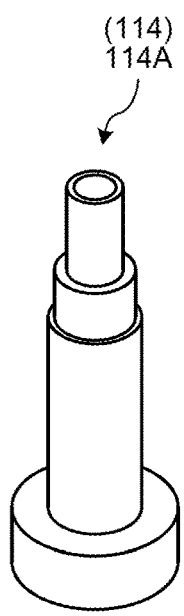
FIG. 8 is a schematic diagram of an example of a shield member enlarged according to the second embodiment.

FIG. 8 is a schematic diagram of an example of the shield member 114A enlarged. The shield member 114A is attached to the sensor-side board 104A and is an electrically conductive component consisting of three components of a pin, a tube, and a spring. An electrically conductive plating layer is provided on the pin positioned at a distal end of the shield member 114A. The electrically conductive plating layer is formed of, for example, gold plating.

Return to FIG. 6 to continue the explanation. The electrically conductive plating layer is also provided at a position on the camera interface-side board 104B where the pin of the shield member 114A comes into contact (hereinafter, referred to as a "land"). According to these configurations, the sensor-side board 104A and the camera interface-side board 104B are electrically connected through the pin of the shield member 114A, the electrically conductive plating layer, and the land of the camera interface-side board 104B. The land has, for example, a size of 0.5 mm and a thickness of 0.1 mm, but the size and the thickness of the land are not limited thereto.

The pin positioned at the distal end of the shield member 114A is spring-like and has a predetermined movement range and a spring pressure. Therefore, the shield member 114A is elastic.

A contact resistance between the shield member 114A and each of the sensor-side board 104A and the camera interface-side board 104B may have any predetermined resistance value capable of lowering a potential of the output mechanism 107A to ground through the shield member 112, the protruding portion 113, the shield member 114A, the shield member 114B, and the front case 103. The contact resistance between the shield member 114A and each of the sensor-side board 104A and the camera interface-side board 104B is, for example, equal to or less than 1.5Ω, preferably equal to or less than 1Ω, and even more preferably equal to or less than 0.5Ω.

The shield member 114A may have any shape and material having electrical conductivity and being capable of achieving contact resistance, with each of the sensor-side board 104A and the camera interface-side board 104B, equal to or less than 1.5Ω. For example, the movement range of the spring-like pin of the shield member 114A is 0.9 mm, and the spring pressure is 1.08 N, but the movement range and the spring pressure are not limited thereto.

The shield member 114B is a component that is attached to the camera interface-side board 104B to reduce electromagnetic noise. The shield member 114B has a sponge core and is surrounded by an electrically conductive fabric. Therefore, the shield member 114B is electrically conductive and elastic.

The shield member 114B is disposed to come into contact with the sensor board fixing screws 105 for fixing the sensor-side board 104A. The sensor board fixing screws 105 are electrically conductive screws. According to these configurations, the sensor-side board 104A and the camera interface-side board 104B are electrically connected through the shield member 114B and the sensor board fixing screws 105.

The shield member 114B may have any compression rate, compression load, shape, and material having electrical conductivity and being capable of achieving contact resistance, with each of the sensor-side board 104A and the camera interface-side board 104B, equal to or less than 1.5Ω. The material of the electrically conductive fabric of the shield member 114B is, for example, a Sn—Cu polyimide film, but not limited thereto. For example, the shield member 114B can achieve the contact resistance of equal to or less than 1.5Ω by being installed in contact to have a compression rate of about 25% and a compression load of equal to or more than 5 N.

Next, an action of the imaging device 100B of the present embodiment will be described.

In the present embodiment, the shield member 112 is electrically conductive and electrically connects the electrically conductive front case 103 and the electrically conductive output mechanism 107A. In detail, the shield member 112 includes the protruding portions 113 and is disposed to come into contact with the front case 103 through the protruding portions 113. Therefore, the front case 103, the output mechanism 107A of the rear case 107, and the shield member 112 are electrically connected.

In the present embodiment, furthermore, a shield member 114 is provided between the plurality of boards 104C. The shield members 114 are an example of the second shield member. The shield member 114 is an electrically conductive and elastic member that electrically connects the plurality of boards 104C.

Therefore, the front case 103, the output mechanism 107A of the rear case 107, the shield member 112, and the plurality of boards 104C are electrically connected. Specifically, the camera interface-side board 104B is electrically connected to the sensor-side board 104A that is fixed to the front case 103 through the shield member 114A and the shield member 114B. Thus, a potential of the front case 103 is approximately the same as that of the output mechanism 107A of the rear case 107, that is, the potential of the front case 103 is approximately the same ground (GND) potential of the output mechanism 107A. That is, the output mechanism 107A of the rear case 107, the shield member 112, the plurality of boards 104C, and the front case 103 are electrically connected, so that the imaging device 100B can have a GND-reinforced structure.

Therefore, the imaging device 100B of the present embodiment can further improve noise immunity in addition to the effect of the first embodiment described above.

Third Embodiment

In the second embodiment, the example of using the shield member 114A and the shield member 114B as the shield members 114 was described as an example. However, the shield members 114 may be any electrically conductive and elastic members that electrically connect the plurality of boards 104C, and are not limited to the shield member 114A and the shield member 114B.

Figure 9:
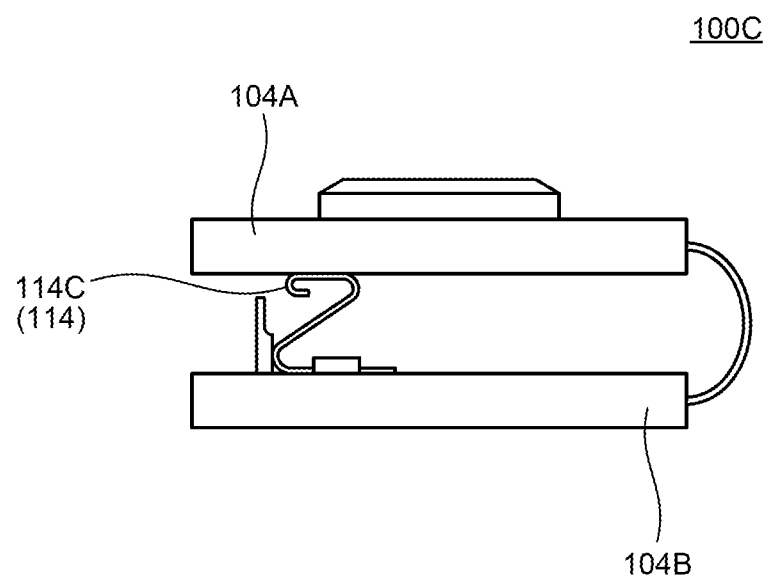
FIG. 9 is a schematic diagram of an example of boards provided in an imaging device according to a third embodiment.

FIG. 9 is a schematic diagram of an example of the boards 104C provided in an imaging device 100C according to the present embodiment. The imaging device 100C of the present embodiment has the same configuration as the imaging device 100 of the first embodiment, except for a configuration in which the plurality of boards 104C are laminated. In addition, the imaging device 100C of the present embodiment has the same configuration as the imaging device 100B of the second embodiment, except that the imaging device 100C is provided with a shield member 114 different from the shield member 114A and the shield member 114B. Therefore, the same numerals are given to the same members as those in the above described embodiments, and detailed explanations will not be repeated.

In the present embodiment, a configuration in which a shield member 114C is provided between the sensor-side board 104A and the camera interface-side board 104B will be described. The shield member 114C is an example of the shield member 114.

Figure 10:
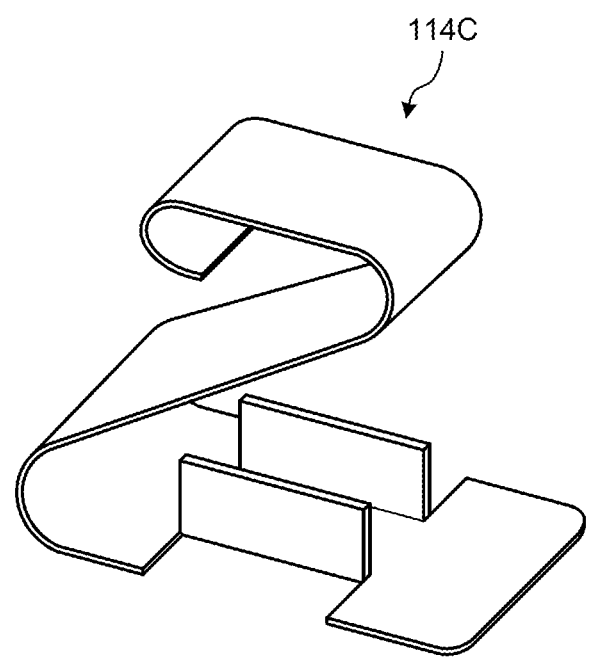
FIG. 10 is a schematic diagram of an example of a shield member enlarged according to the third embodiment.

FIG. 10 is a schematic diagram of an example of the shield member 114C enlarged. As illustrated in FIGS. 9 and 10, the shield member 114C is a shield member 114 with a shape different from the shield member 114A and the shield member 114B.

The shield member 114C is attached to the camera interface-side board 104B and is a component to strengthen the ground between the plurality of boards 104C. The shield member 114C is formed using, for example, phosphor bronze for a spring and is plated with a Sn reflow plating on a surface thereof. A portion where the shield member 114C comes into contact with the sensor-side board 104A is subjected to a metal surface treatment. According to these configurations, the sensor-side board 104A and the camera interface-side board 104B are electrically connected through the shield member 114C.

A contact resistance between the shield member 114C and each of the sensor-side board 104A and the camera interface-side board 104B may have any predetermined resistance value capable of lowering a potential of the output mechanism 107A to ground through the shield member 112, the protruding portion 113, the shield member 114C, and the front case 103. The contact resistance between the shield member 114C and each of the sensor-side board 104A and the camera interface-side board 104B is, for example, equal to or less than 1.5Ω, preferably equal to or less than 1Ω, and even more preferably equal to or less than 0.5Ω.

The shield member 114C may have any shape and material having electrical conductivity and being capable of achieving contact resistance, with each of the sensor-side board 104A and the camera interface-side board 104B, equal to or less than 1.5Ω.

Next, an action of the imaging device 100C of the present embodiment will be described.

In the present embodiment, the shield member 112 is electrically conductive and electrically connects the electrically conductive front case 103 and the electrically conductive output mechanism 107A. In detail, the shield member 112 includes the protruding portions 113 and is disposed to come into contact with the front case 103 through the protruding portions 113. Therefore, the front case 103, the output mechanism 107A of the rear case 107, and the shield member 112 are electrically connected.

In the present embodiment, furthermore, the shield member 114C is provided between the plurality of boards 104C. The shield member 114C is the example of the second shield member. The shield member 114C is an electrically conductive and elastic member that electrically connects the plurality of boards 104C.

Therefore, the front case 103, the output mechanism 107A of the rear case 107, the shield member 112, and the plurality of boards 104C are electrically connected. Specifically, the camera interface-side board 104B is electrically connected to the sensor-side board 104A that is fixed to the front case 103 through the shield member 114C. Thus, a potential of the front case 103 is approximately the same as that of the output mechanism 107A of the rear case 107, that is, the potential of the front case 103 is approximately the same GND potential of the output mechanism 107A. That is, the output mechanism 107A of the rear case 107, the shield member 112, the plurality of boards 104C, and the front case 103 are electrically connected, so that the imaging device 100C can have a GND-reinforced structure. In a case in which the front case 103 and the output mechanism 107A of the rear case 107 are electrically connected directly, the shield member 112 may not be employed.

Therefore, the imaging device 100C of the present embodiment can further improve noise immunity in addition to the effect of the first embodiment described above.

The shield members 114 may be any electrically conductive and elastic members that electrically connect the plurality of boards 104C, and are not limited to the shield member 114A, the shield member 114B, and the shield member 114C.

For example, a configuration in which the shield member 114A, the shield member 114B, and the shield member 114C are provided between the plurality of boards 104C may be adopted. In addition, a configuration in which the shield member 114A and the shield member 114C are provided between the plurality of boards 104C may be adopted. In this case, a material, shape, number, position, and the like that enable the contact resistance between the boards 104C and the shield members 114 to be equal to or less than the above predetermined value may be selected.

The imaging device according to the present disclosure can improve noise immunity.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. An imaging device comprising:
   a lens barrel incorporating into a lens;
   a sensor board comprising an imaging element
   a first case having electrical conductivity, the first case comprising a supporting portion supporting the lens barrel, a first side wall portion extending from the supporting portion and having a first inner surface, a second side wall portion extending from the supporting portion and having a second inner surface, a third side wall portion extending from the supporting portion and having a third inner surface, and a fourth sidewall portion extending from the supporting portion and having a fourth inner surface, at least part of the sensor board being between the first inner surface of the first sidewall portion and the third inner surface of the third sidewall portion, and at least part of the sensor board being between the second inner surface of the second side wall portion and the fourth inner surface of the fourth side wall portion;
   a second case attaching to a first end portion of the first side wall portion of the first case, a second end portion of the second side wall portion of the first case, a third end portion of the third side wall portion of the first case, and a fourth end portion of the fourth side wall portion of the first case, the at least part of the sensor board being between the supporting portion and the second case;
   an output mechanism configured to output a signal output from the imaging element; and
   a shield member having a rectangular shape and electrically connecting to the output mechanism and disposed between the sensor board and the second case, the rectangular shape having a first side, a second side, a third side, and a fourth side, wherein the shield member comprises:
      a first contact portion extending from a first part of the first side of the rectangular shape of the shield member, toward the supporting portion of the first case;
      a second contact portion extending from a second part of the second side of the rectangular shape of the shield member, toward the supporting portion of the first case;
      a third contact portion extending from a third part of the third side of the rectangular shape of the shield member, toward the supporting portion of the first case; and
      a fourth contact portion extending from a fourth part of the fourth side of the rectangular shape of the shield member, toward the supporting portion of the first case;
   wherein a first contact point of the first contact portion of the shield member contacts to the first inner surface of the first side wall portion of the first case,
   a second contact point of the second contact portion of the shield member contacts to the second inner surface of the second side wall portion of the first case,
   a third contact point of the third contact portion of the shield member contacts to the third inner surface of the third side wall portion of the first case, and
   a fourth contact point of the fourth contact portion of the shield member contacts to the fourth inner surface of the fourth side wall portion of the first case.

2. The imaging device according to claim 1, wherein a central portion of the shield member protrudes away from the lens barrel, is between the sensor board and the second case, and the output mechanism is installed on the central portion of the shield member.

3. The imaging device according to claim 1, wherein each of the first contact portion, the second contact portion, the third contact portion, and the fourth contact portion has elasticity.

4. The imaging device according to claim 3, wherein a contact resistance between the first case and the first contact portion, the second contact portion, the third contact portion, and the fourth contact portion is equal to or less than 1 Ω.

5. The imaging device of claim 1, wherein the shield member further comprising:
   a fifth contact portion extending from a fifth part of the first side of the rectangular shape of the shield member, toward the supporting portion of the first case;

a sixth contact portion extending from a sixth part of the second side of the rectangular shape of the shield member, toward the supporting portion of the first case;

a seventh contact portion extending from a seventh part of the third side of the rectangular shape of the shield member, toward the supporting portion of the first case; and an eighth contact portion extending from an eighth part of the fourth side of the rectangular shape of the shield member, toward the supporting portion of the first case.

6. The imaging device of claim 5, wherein:

a fifth contact point of the fifth contact portion of the shield member, contacts to the first inner surface of the first side wall portion of the first case, a sixth contact point of the sixth contact portion of the shield member, contacts to the second inner surface of the second side wall portion of the first case, a seventh contact point of the seventh contact portion of the shield member, contacts to the third inner surface of the third side wall portion of the first case, and an eighth contact point of the eighth contact portion of the shield member, contacts to the fourth inner surface of the fourth side wall portion of the first case.

7. The imaging device according to claim 1, wherein the first contact portion of the shield member has at least a first planer section and a second planer section between the first part of the first side and the first contact point, the first planer section and the second planer section being arranged continuously from the first part of the first side to the first contact point, the first planer section being closer to the first part of the first side than the second planer section, the second planer section being closer to the first contact point than the first planer section, the first planer section being bent towards the third inner surface of the third side wall portion from the first part of the first side, and the second planer section being bent towards the first inner surface of the first side wall portion from the first planer section.

8. The imaging device of claim 7, wherein the second contact portion of the shield member has at least a third planer section and a fourth planer section between the second part of the second side and the second contact point, the third planer section and the fourth planer section being arranged continuously from the second part of the second side to the second contact point, the third planer section being closer to the second part of the second side than the fourth planer section, the fourth planer section being closer to the second contact point than the third planer section, the third planer section being bent towards the fourth inner surface of the fourth side wall portion from the second part of the second side, and the fourth planer section being bent towards the second inner surface of the second side wall portion from the third planer section.

9. The imaging device of claim 8, wherein the third contact portion of the shield member has at least a fifth planer section and a sixth planer section between the third part of the third side and the third contact point, the fifth planer section and the sixth planer section being arranged continuously from the third part of the third side to the third contact point, the fifth planer section being closer to the third part of the third side than the sixth planer section, the sixth planer section being closer to the third contact point than the fifth planer section, the fifth planer section being bent towards the first inner surface of the first side wall portion from the third part of the third side, and the sixth planer section being bent towards the third inner surface of the third side wall portion from the fifth planer section.

10. The imaging device of claim 9, wherein the fourth contact portion of the shield member has at least a seventh planer section and a eighth planer section between the fourth part of the fourth side and the fourth contact point, the seventh planer section and the eighth planer section being arranged continuously from the fourth part of the fourth side to the fourth contact point, the seventh planer section being closer to the fourth part of the fourth side than the eighth planer section, the eighth planer section being closer to the seventh contact point than the seventh planer section, the seventh planer section being bent towards the second inner surface of the second side wall portion from the fourth part of the fourth side, and the eighth planer section being bent towards the fourth inner surface of the fourth side wall portion from the seventh planer section.

11. The imaging device of claim 1, further comprising a ring-shaped packing, a first part of the ring-shaped packing being disposed between the first end portion of the first side wall portion of the first case and the second case, a second part of the ring-shaped packing being disposed between the second end portion of the second side wall portion of the first case and the second case, a third part of the ring-shaped packing being disposed between the third end portion of the third side wall portion of the first case and the second case, and a fourth part of the ring-shaped packing being disposed between the fourth end portion of the fourth side wall portion of the first case and the second case.

12. The imaging device of claim 11, wherein the ring-shaped packing is elastic material.

13. The imaging device of claim 11, wherein the ring-shaped packing is pressed by the first end portion of the first side wall portion of the first case, the second end portion of the second side wall portion of the first case, the third end portion of the third side wall portion of the first case, the fourth end portion of the fourth side wall portion of the first case, and the second case.

14. The imaging device of claim 11, wherein the ring-shaped packing is waterproof.

15. The imaging device of claim 1, wherein the first case is made of metal.

16. The imaging device of claim 15, wherein the second case is made of resin.

* * * * *